(12) United States Patent
Hoekstra et al.

(10) Patent No.: US 9,672,938 B2
(45) Date of Patent: Jun. 6, 2017

(54) MEMORY WITH REDUNDANCY

(71) Applicants: George P. Hoekstra, Austin, TX (US);
Perry H. Pelley, Austin, TX (US);
Ravindraraj Ramaraju, Round Rock, TX (US)

(72) Inventors: George P. Hoekstra, Austin, TX (US);
Perry H. Pelley, Austin, TX (US);
Ravindraraj Ramaraju, Round Rock, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/258,730

(22) Filed: Apr. 22, 2014

(65) Prior Publication Data

US 2015/0302939 A1 Oct. 22, 2015

(51) Int. Cl.
*G11C 7/00* (2006.01)
*G11C 29/44* (2006.01)
*G11C 29/00* (2006.01)
*G11C 29/12* (2006.01)

(52) U.S. Cl.
CPC .......... *G11C 29/44* (2013.01); *G11C 29/83* (2013.01); *G11C 29/12* (2013.01)

(58) Field of Classification Search
CPC .......... G11C 29/83; G11C 29/76; G11C 29/12
USPC .............. 365/200, 189.05, 210, 230.08
See application file for complete search history.

(56) References Cited

U.S. PATENT DOCUMENTS

| | | | |
|---|---|---|---|
| 5,231,604 A * | 7/1993 | Watanabe | 365/189.05 |
| 5,548,553 A * | 8/1996 | Cooper | G11C 29/80 |
| | | | 365/189.02 |
| 6,577,524 B2 | 6/2003 | Brooks et al. | |
| 6,597,629 B1 | 7/2003 | Raszka et al. | |
| 7,415,640 B1 * | 8/2008 | Zorian et al. | 714/711 |
| 7,684,264 B2 | 3/2010 | Hunter et al. | |
| 7,698,536 B2 | 4/2010 | Dieffenderfer et al. | |
| 8,014,215 B2 | 9/2011 | Lee et al. | |
| 8,976,604 B2 * | 3/2015 | Hung | 365/189.05 |
| 2003/0133335 A1 * | 7/2003 | Ohbayashi et al. | 365/200 |
| 2011/0090745 A1 | 4/2011 | La Rosa | |
| 2011/0157987 A1 * | 6/2011 | Cernea | 365/185.09 |

OTHER PUBLICATIONS

Ghasemi, H.R., et al., "Low-Voltage On-chip Cache Architecture Using Heterogeneous Cell Sizes for High-Performance Processors", 2011 IEEE 17th International Symposium on High Performance Computer Architecture (HPCA), Feb. 12-16, 2011, pp. 38-49.

Kuhn, K.J., et al., "Process Technology Variation", IEEE Transactions on Electron Devices, vol. 58, Issue 8, Aug. 2011, pp. 2197-2208.

(Continued)

*Primary Examiner* — Pho M Luu
*Assistant Examiner* — Mohammed A Bashar

(57) ABSTRACT

Structures for substituting single bits in an array may include a first array having a plurality of word lines, and for each of the plurality of word lines a memory operable to store a bit substitution column value, and a first data output line operable to communicate the bit substitution column value to a write data shifter. The bit substitution column value may be associated with a bit substitution column in a second array, and the write data shifter may be operable to substitute the bit by shifting data to a redundancy column in the first array.

20 Claims, 3 Drawing Sheets

(56) References Cited

OTHER PUBLICATIONS

Zhou, S., et al., "Minimizing Total Area of Low-Voltage SRAM Arrays through Joint Optimization of Cell Size, Redundancy, and ECC", 2010 Conference on Computer Design (ICCD), Oct. 3-6, 2010, pp. 112-177.

U.S. Appl. No. 13/537,209, "Memory With Word Line Access Control", filed Jun. 29, 2012.

Dedeepya, T., et al., "A Novel Approach of Repair in Bisr for Ram's", Indian Journal of Research, Paripex, Research Paper, vol. 2, Issue 9, Sep. 2013, pp. 104-106.

Wilkerson, C., et al., "Scaling the Memory Reliability Wall", Intel Technology Journal, vol. 17, Issue 1, May 2013.

U.S. Appl. No. 13/537,209, Rejection mailed Jan. 29, 2015.

U.S. Appl. No. 13/537,209, Ramaraju, R., et al., "Memory With Word Line Access Control", Office Action—Rejection—Mailed Jun. 4, 2015.

U.S. Appl. No. 13/537,209, Ramaraju, R., et al., "Memory With Word Line Access Control", filed Jun. 29, 2012, Office Action—Notice of Allowance, mailed on Oct. 9, 2015.

* cited by examiner

MEMORY WITH REDUNDANCY

BACKGROUND

Field

This disclosure relates generally to semiconductor integrated circuits having a memory, and more specifically, to having a memory with redundancy.

Related Art

Redundancy in memories has been found to be advantageous because typically the vast majority of the bits meet a specified criteria and only a relatively few do not. Though many failed bits are single bit failures, they often nonetheless come in locations that are in close proximity such as along a row or column. Thus, it has been found to be efficient to replace whole sets of rows or sets of columns with redundant elements of corresponding size in order to replace all types of bit failures. This is considered easier to implement than other approaches. Thus, typical schemes are much less effective when there are single bit failures scattered among the rows and columns since large redundant elements are used to replace a single bit failures.

Accordingly there is a need to provide further improvement in redundancy, especially for single bit failures.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a memory with redundancy can address scattered single bit failures by utilizing a set of a predetermined number of columns of bits to address a failure of any bit along any row. Each redundant set of the predetermined number of columns that is added adds another bit to each row that can be replaced. This is particularly useful in situations where failures are being detected due to reducing the voltage applied to the memory array. Often this power supply is called VDD. Any decrease in the magnitude of VDD reduces power consumption. As the power is reduced, failures will ultimately occur. These failures tend to be single bit failures instead of group of failures along a single row or column. Replacing these single bit failures with good bits allows for the lowering of the magnitude of VDD. This reduction is enhanced because the power is related to the square of VDD. This is better understood by reference to the drawings and the following description.

Figure 1:
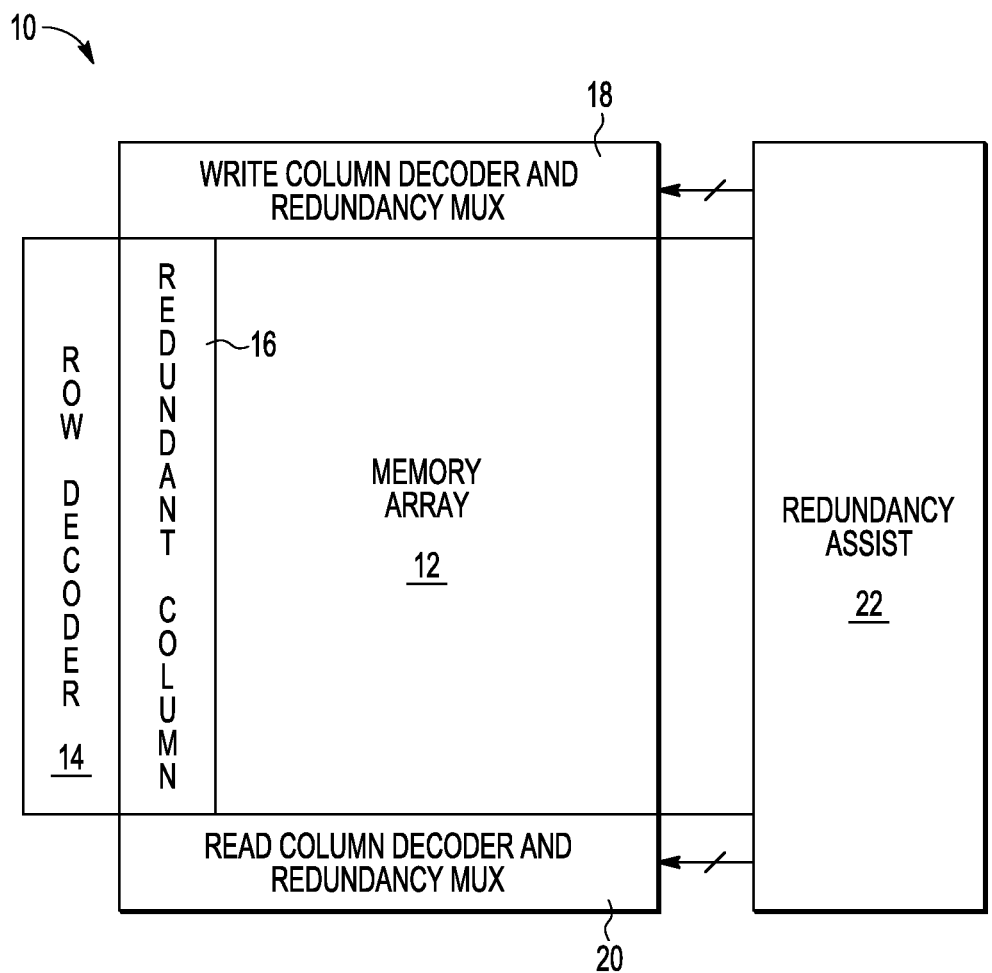
FIG. 1 is a block diagram of a memory having redundancy according to a first embodiment.

Shown in FIG. 1 is a memory 10 having a memory array 12, a row decoder 14, a redundant column 16 between row decoder 14 and memory array 12, a write column decoder and redundancy multiplexer (mux in the FIG. 18 coupled to memory array 12, a read column decoder and redundancy multiplexer 20 coupled to memory array 12, and a redundancy assist circuit 22 coupled to array 12, a write column decoder and redundancy multiplexer 18, and read column decoder and redundancy multiplexer 20. In operation, row decoder 14 responds to a row address and enables a selected word line that in turn enables memory cells coupled to the selected word line in memory array 12, redundant column 16, and redundant assist 22. In a read mode, read column decoder and redundancy multiplexer 20 provides the data from the memory cells along the selected word line. Redundancy assist circuit 22 provides necessary control for the reading if there is a redundant cell from redundant column 16 replacing a memory cell from memory array 12. Similarly, in a write mode, write column and redundancy multiplexer 18 provides the data to the bit lines for writing the memory cells connected to the enable word line. Redundancy assist circuit 22 provides necessary control for the writing if there is a redundant cell from redundant column 16 replacing a memory cell from memory array 12. Read column decoder and redundancy multiplexer 20 may be considered a read data shifter. Write column decoder and redundancy multiplexer 18 may be considered a write data shifter.

Figure 2:
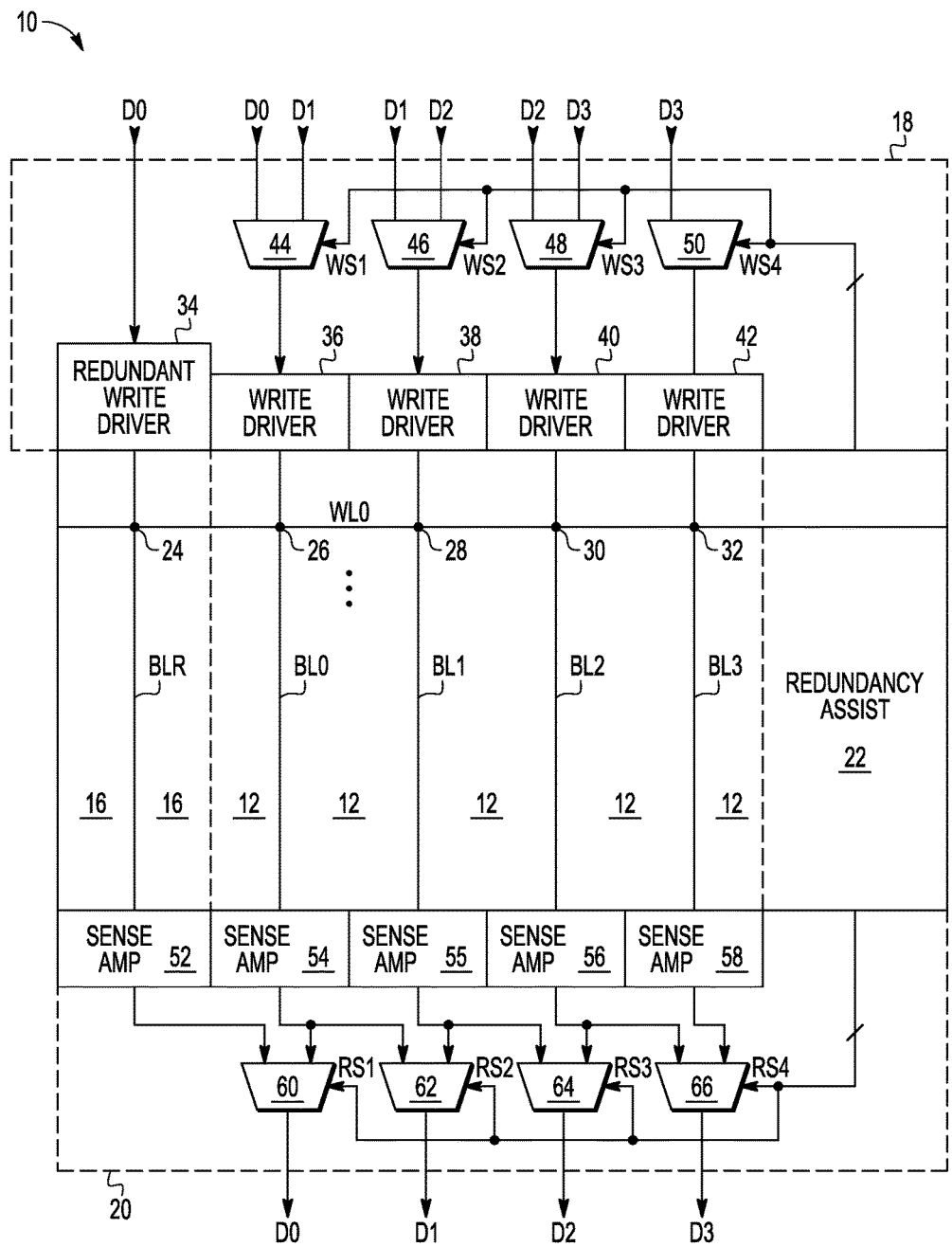
FIG. 2 is a block diagram of a portion of the memory of FIG. 1 showing more detail.
Figure 3:
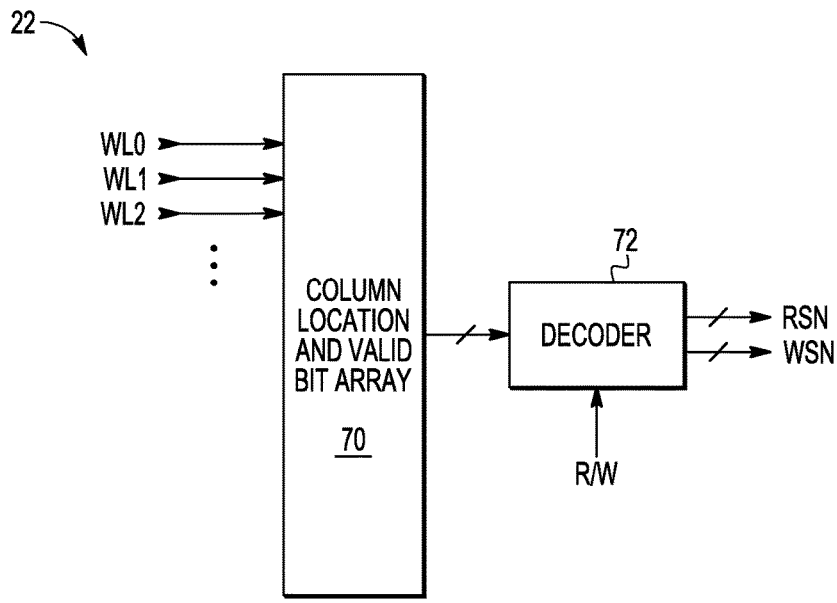
FIG. 3 is a is a block diagram of a portion of the memory of FIG. 1 showing more detail of a block shown in FIG. 2.

Shown in FIG. 2 is a portion of memory 10 showing more detail. Memory array 12 includes a portion of word line WL0 as well as portions of other word lines not shown in FIG. 2, bit lines BL0, BL1, BL2, and BL3, and memory cells 26, 28, 30, and 32 at intersections of word line WL0 with bit lines BL0, BL1, BL2, and BL3, respectively. Some of the additional word lines are shown in FIG. 3. Other memory cells are at intersections of other word lines not shown with bit lines BL0, BL1, BL2, and BL3, Redundant column 16 includes a portion of word line WL0 as well as portions of other word lines not shown that extend across memory array 12, a redundant bit line BLR, and a memory cell 24 at the intersection of word line WL0 and redundant bit line BLR. Other memory cells not shown are at the other intersections of the word lines and bit line BLR. Read column decoder and redundancy multiplexer 20 includes sense amps 52, 54, 55, 56, and 58 coupled to bit lines BLR, BL0, BL1, BL2, and BL3 respectively, and multiplexers 60, 62, 64, and 66 that provide output signals D0, D1, D2, and D3, respectively. Multiplexers 60, 62, 64, and 66 have selection inputs that receive read select signals RS1, RS2, RS3, and RS4, respectively, from redundancy assist circuit 22. Write column decoder and redundancy multiplexer 18 includes write drivers 34, 36, 38, 40, and 42 coupled to bit lines BLR, BL0, BL1, BL2, and BL3 respectively, and multiplexers 44, 46, 48, and 50 that provide data to be written to write drivers 36, 38, 40, and 42, respectively. Multiplexers 44, 46, 48, and 50 have selection inputs that receive write select signals WS1, WS2, WS3, and WS4, respectively, from redundancy assist circuit 22. Write driver 34, which is a redundant write driver, receives input signal D0. Multiplexer 44 receives input signals D0 and D1. Multiplexer 46 receives input signal D1 and D2. Multiplexer 48 receives input signals D2 and D3. Multiplexer 50 receives input signals D3 and D4. The bits along a bit line such as bit lines BL0, BL1, BL2, and BL3 may be considered bit substitution columns because they have memory locations that may be substituted with a memory location coupled to bit line BLR.

In normal operation in which redundancy is not used, input signals, D0, D1, D2, and D3 are written into write drivers 36, 38, 40, and 42 as selected by write select signals WS1, WS2, WS3, and WS4. Write drivers 36, 38, 40, and 42 in turn write the received data onto bit lines BL0, BL1, BL2, and BL3, respectively. This has the effect of writing the data onto the memory cells of memory array 12 that are coupled to the enabled word line. In the case of word line WL0 being enabled, memory cells 26, 28, 30, and 32 are written with the data of input signals D0, D1, D2, and D3. In a subsequent read in which word line WL0 is enabled, sense amps 54, 55, 56, and 58 sense the data from memory cells 26, 28, 30, and 32 and output that data accordingly. Multiplexers 60, 62, 64, and 66 then output the data from sense amps 54, 55, 56, and 58 as output signals D0, D1, D2, and D3, respectively.

For the case where redundancy is implemented, redundancy assist circuit 22 utilizes a memory cell from redundant column 16 that is coupled to the enabled word line to achieve a single bit replacement. For example, if memory cell 28 is desired to be replaced, the replacement can be achieved utilizing memory cell 24 that is coupled to the word line to which memory cell 28 is coupled. Beginning with a write, input signal D0 is written into redundant write driver 34, input signal D1 is written into write driver 36 through multiplexer 44 as selected by write select WS1, input signal D2 is written into write driver 40 through multiplexer 48 as selected by select signal WS2, and input signal D3 is written into write driver 42 through multiplexer 50 as selected by select signal WS3. No data written into write driver 38 because bit line BL1 and defective memory cell 28 are deselected by multiplexer 46. Redundant write driver 34 writes input signal D0 into memory cell 24, and write drivers 36, 40, and 42 into memory cells 26, 30, and 32, respectively. The result is that memory cells 24, 26, 30, and 32 are storing input signals D0, D1, D2, and D3. The data is shifted to the left from memory cell 28, the memory cell being replaced. For reading when word line WL0 is enabled, sense amp 52 reads the state of memory cell 24, sense amp 54 reads the state of memory cell 26, sense amp 56 reads the state of memory cell 30, and sense amp 58 reads the state of memory cell 32. Sense amp 55 may read the state of memory cell 28 but such reading is irrelevant. Sense amps 52, 54, 56, and 58 provide outputs to multiplexers 60, 62, 64, and 66 that correspond to the states of memory cells 24, 26, 30, and 32 which are the states corresponding to input signals D0, D1, D2, and D3. Multiplexer 60, 62, 64, and 66 output the contents of sense amps 52, 54, 56, and 58 as output signals D0, D1, D2, and D3 in response to read select signals RS1, RS2, RS3, and RS4. The output data that is provided has been shifted to the right from the sense amp coupled to the redundant bit line, bit line BLR, to the location where the replaced memory cell, memory cell 28 in this case, is located.

Shown in FIG. 3 is redundancy assist circuit 22 having a memory 70 shown as receiving word lines WL0, WL1, and WL2 and a decoder 72 that is coupled to memory 70 and receives a read/write signal. The enabled word line causes memory 70 to output the column address of the bad bit, if any, along the enabled word line and a valid bit to indicate if there is a bit to be replaced along the enabled word line. Decoder 72 responds to the output of memory 70, when a column address is received and a replacement at that location is indicated as valid by the valid bit, with read select signals RSN when a read is being performed and select signals WSN when a write is being performed. The information identifying the location for replacement may be considered a bit substitution column value. For this example of the case of four bit lines and one redundant bit line of FIG. 2, read select signals RSN comprise read select signals RS1, RS2, RS3, and RS4 and write select signals WSN comprise WS1, WS2, WS3, and WS4. Memory 70 may be loaded with the relevant redundancy information in response to a test for determining memory locations that need to be replaced. The test can be a built in self test (BIST) or a one time test prior to shipping the memory to a customer. In the event of a one time test, the information is stored in a non-volatile memory. Even if the test is a BIST, it may still be advantageous to store the information in a non-volatile memory. In the case that it is stored in a non-volatile memory, it still may be beneficial that the contents would be further loaded into a memory, like memory 70, where the word lines can be extended directly to the memory array, such as memory array 12, being actively used. Memory 70 may be designed to operate faster than memory array 12. For example, in the case of memory array 12 being a static random access memory, memory array 12 may use a 6 transistor cell and memory 70 may use an 8 transistor cell providing two extra transistors for high speed reading.

Figure 4:
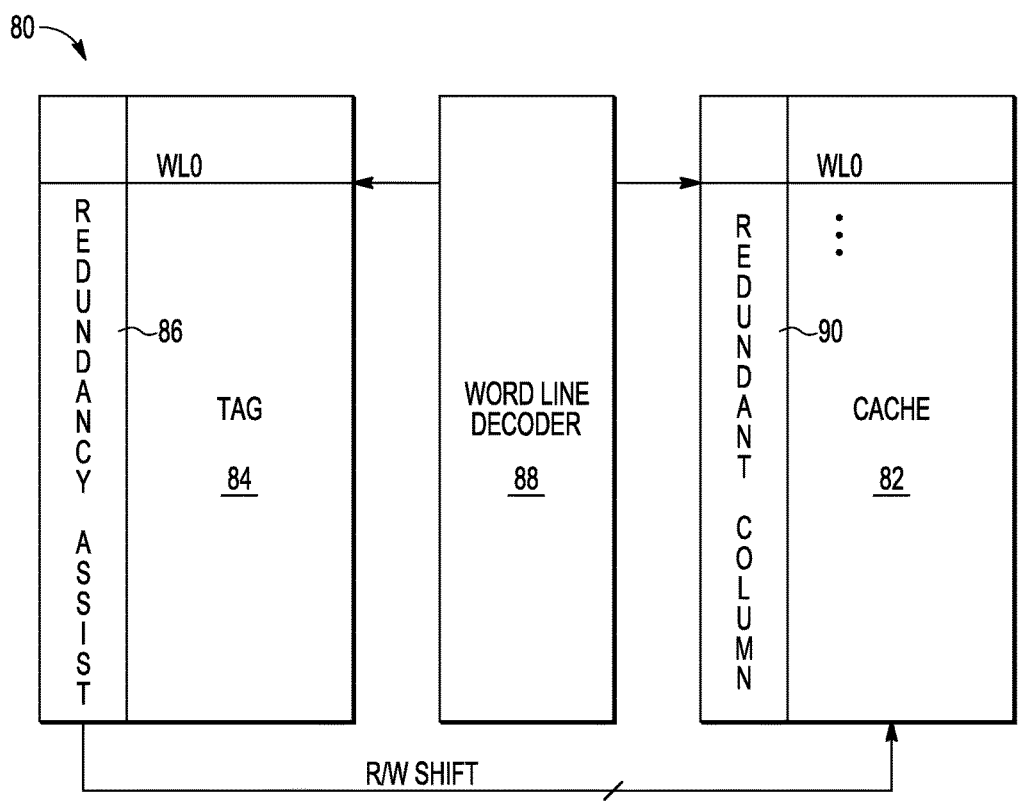
FIG. 4 is a block diagram of a memory having redundancy according to a second embodiment.

Shown in FIG. 4 is a memory system 80 having a cache 82, a TAG 84, a redundant assist circuit 86 connected to TAG 84, a word line driver 88, and a redundant column connected to cache 82. Word line decoder 88 may comprise a first word line decoder for cache 82 with redundant column 90 and a second word line decoder for Tag 84 with redundancy assist 86. Cache 82 and redundant column 90 function together in the same manner as memory array 12 and redundant column 16. In operation system 80 responds to a received address that, for example, selects a word line WL0 in both cache 82 and TAG 84. Although in separate arrays, WL0 in both TAG 84 and cache 82 are selected at the same time in response to the same address and thus may be considered, from a logic standpoint, the same word line. Cache 82 contains data and TAG 84 determines if the data being accessed along word line WL0 in cache 82 is the correct data for the address being received. Memory cells in redundant column 90 may be used to replace any memory cell, for a given selected word line, on the selected word line in the manner described for memory 10. The difference is that function of redundancy assist 86 is initiated from the array of TAG 84. This can be advantageous because TAG 84 will normally have a much shorter word line length than the word lines of cache 82 and may be accessed earlier than cache 82. Thus the data shifting controlled by redundancy assist 86 will be available sooner than if attached to cache 82.

This type of redundancy is generally useful and may be useful in ways not typical for redundancy for a situation that is becoming more significant. A common mode of operation for a memory is to have a mode in which the voltage to the array is reduced until bits begin to appear to fail and these tend to appear as single bit failures in that a location of one apparent failed bit does not suggest that there is likely to be another on the same word line. Thus, a single apparent failed bit does not necessarily mean that no further supply voltage reduction is possible. For the case of just one redundant column like redundant columns 16 and 90 and the corresponding redundancy assist, it may be possible to continue reducing the supply voltage as apparent failures continue to appear because those further failures may not be on the same word line. Further redundant columns may also be used to allow further supply voltage reductions.

By now it should be appreciated that there has been provided a first array having a plurality of word lines. For each of the plurality of word lines a memory operable to store a bit substitution column value, the bit substitution column value associated with a bit substitution column in a second array, the bit substitution column including a bit to be substituted. Also for each of the plurality of word lines a first data output line operable to communicate the bit substitution column value to a write data shifter, wherein the write data shifter is operable to substitute the bit by shifting data to a redundancy column in the first array. The first array may have a further characterization by which the first data output line is further operable to communicate the bit substitution column value to a read data shifter, the read data shifter operable to substitute the bit by shifting data from a redundancy column in the first array. The first array may have a further characterization by which the first data output line is further operable to communicate the bit substitution column value to a decoder, the decoder operable to decode the bit substitution column value. The first array may have a further characterization by which the first and second arrays are subarrays of a larger third array. The first array may have further characterization by which the first and second arrays are located remote from one another. The first array may further include, for each of the plurality of word lines, a second data output line operable to communicate a valid address value. The first array may have a further characterization by which the second data output line is operable to communicate the valid address value to the write data shifter and the read data shifter. The first array may have a further characterization by which the bit is associated with a minimum supply voltage. The first array may have a further characterization by which the bit substitution column value is stored in the memory as part of an automatic built-in self test process. The first array may have a further characterization by which the bit substitution column value is stored in the memory as part of an initialization process. The first array may have a further characterization by which the first array further comprises an enablement line, the enablement line operable to selectively power a portion of the first array. The first array may have a further characterization by which the first array operates at a speed faster than the speed at which the second array operates such that an access penalty associated with the first array may be less than an access time associated with the second array. The first array may further include, for each of the plurality of word lines, a second memory operable to store a second bit substitution column value, the second bit substitution column value associated with a second bit substitution column in the first array, the second bit substitution column including a second bit to be substituted, a second data output line operable to communicate the second bit substitution column value to a second write data shifter, wherein the second write data shifter is operable to substitute the second bit by shifting data to a second redundancy column in the first array, and a write data shifter select line operable to communicate a write data shifter select value to the write data shifter and the second write data shifter. The first array may further include, for each of the plurality of word lines, the second data output line is further operable to communicate the second bit substitution column value to a second read data shifter, wherein the second read data shifter is operable to substitute the second bit by shifting data from the second redundancy column and a read data shifter select line operable to communicate a read data shifter select value to the read data shifter and the second read data shifter. The first array may have a further characterization by which the first array comprises nonvolatile memory.

Also described is a system for implementing data redundancy having a memory array. The memory array includes a plurality of word lines, a bit substitution column including a bit to be substituted, and a redundancy column. The system further includes a read shifter coupled to the memory array. The system further includes a write shifter coupled to the memory array. The system further includes a programmable assist array coupled to the plurality of word lines and including, for each of the plurality of word lines, a memory operable to store a bit substitution column value associated with the bit substitution column, a first data output line operable to communicate the bit substitution column value to the read shifter and the write shifter, and a second data output line operable to communicate a valid address value to the read shifter and the write shifter. The write shifter is operable to substitute the bit by shifting data to the redundancy column in response to the bit substitution column value and a valid address value. The read shifter is operable to substitute the bit by shifting data from the redundancy column in response to the bit substitution column value and the valid address value. The system may further include a decoder coupled to the programmable assist array and the read shifter, the decoder operable to decode the bit substitution column value. The system may further include a decoder coupled to the programmable assist array and the write shifter, the decoder operable to decode the bit substitution column value.

Described also is a system for implementing redundancy including a memory array. The memory array includes a first plurality of word lines responsive to a row address, a bit substitution column including a bit to be substituted, and a redundancy column. The system includes. The system includes a read shifter coupled to the memory array. The system includes a write shifter coupled to the memory array. The system includes a programmable assist array comprising a second plurality of word lines responsive to the row address, wherein for each of the second plurality of word lines. The programmable assist array includes a memory operable to store a bit substitution column value associated with the bit substitution column, a first data output line operable to communicate the bit substitution column value to the read shifter and the write shifter, and a second data output line operable to communicate a valid address value to the read shifter and the write shifter. The write shifter is operable to substitute the bit by shifting data to the redundancy column in response to the bit substitution column value and a valid address value. The read shifter is operable to substitute the bit by shifting data from the redundancy column in response to the bit substitution column value and the valid address value. The system may further include a decoder coupled to the programmable assist array, the decoder operable to decode the bit substitution column value.

Although the invention is described herein with reference to specific embodiments, various modifications and changes can be made without departing from the scope of the present invention as set forth in the claims below. For example, other shapes for the power buses may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A first array comprising:
   a plurality of word lines;
   for each of the plurality of word lines:
      a memory operable to store a bit substitution column value, the bit substitution column value associated with a bit substitution column in a second array, the bit substitution column including a bit to be substituted, the bit corresponding to a failure detected by reducing a voltage applied to the first array; and
      a first data output line operable to communicate the bit substitution column value to a write column redundancy multiplexer, wherein the write column redundancy multiplexer is operable to substitute the bit by writing first data to a redundancy column in the first array in response to a first control signal from a redundancy assist circuit coupled to the first array, the redundancy assist circuit to generate the first control signal in response to the failure being detected, the write column redundancy multiplexer to the first data to a first column in the first array in response to a second control signal from the redundancy assist circuit the redundancy assist circuit to generate the second control signal in response to the failure not being detected.

2. The first array of claim 1, wherein the first data output line is further operable to communicate the bit substitution column value to a read column redundancy multiplexer, the read column redundancy multiplexer operable to substitute the bit by reading the first data from the redundancy column in the first array based on a third control signal from the redundancy assist circuit.

3. The first array of claim 1, wherein the first data output line is further operable to communicate the bit substitution column value to a decoder, the decoder operable to decode the bit substitution column value.

4. The first array of claim 1, wherein the first and second arrays are subarrays of a larger third array.

5. The first array of claim 1, wherein the first and second arrays are located remote from one another.

6. The first array of claim 2, further comprising for each of the plurality of word lines, a second data output line operable to communicate a valid address value.

7. The first array of claim 6, wherein the second data output line is operable to communicate the valid address value to the write column redundancy multiplexer and the read column redundancy multiplexer.

8. The first array of claim 1, wherein reducing a voltage applied to the first array includes reducing the voltage below a minimum operating voltage of the first array.

9. The first array of claim 1, wherein the bit substitution column value is stored in the memory as part of an automatic built-in self test process.

10. The first array of claim 1, wherein the bit substitution column value is stored in the memory as part of an initialization process.

11. The first array of claim 1, wherein the first array further comprises an enablement line, the enablement line operable to selectively power a portion of the first array.

12. The first array of claim 1, wherein the first array operates at a speed faster than the speed at which the second array operates such that an access penalty associated with the first array may be less than an access time associated with the second array.

13. The first array of claim 1, further comprising for each of the plurality of word lines:
   a second memory operable to store a second bit substitution column value, the second bit substitution column value;
   a second data output line operable to communicate the second bit substitution column value to the write column redundancy multiplexer, wherein the write column redundancy multiplexer is operable to substitute a second bit by writing second data to the first column in the first array based on the first control signal, the write column redundancy multiplexer to write the second data to a second column in the first array in response the second control signal from the redundancy assist circuit; and
   a write column redundancy multiplexer select line operable to communicate a write column redundancy multiplexer select value of the first control signal to the write column redundancy multiplexer.

14. The first array of claim 13, further comprising for each of the plurality of word lines:
   the second data output line is further operable to communicate the second bit substitution column value to the read column redundancy multiplexer, wherein the read column redundancy multiplexer is operable to substitute the second bit by reading the second data from the first column based on the third control signal; and
   a read column redundancy multiplexer select line operable to communicate a read column redundancy multiplexer select value of the third control signal to the read column redundancy multiplexer.

15. The first array of claim 1, wherein the first array comprises nonvolatile memory.

16. A system for implementing data redundancy, the system comprising:
   a memory array comprising:
      a plurality of word lines;
      a bit substitution column including a bit to be substituted, the bit corresponding to a failure detected by reducing a voltage applied to the memory array; and
      a redundancy column;
   a read column redundancy multiplexer coupled to the memory array;
   a write column redundancy multiplexer coupled to the memory array; and
   a programmable assist array coupled to the plurality of word lines and comprising, for each of the plurality of word lines:
      a memory operable to store a bit substitution column value associated with the bit substitution column;
      a first data output line operable to communicate the bit substitution column value to the read column redundancy multiplexer and the write column redundancy multiplexer; and
      a second data output line operable to communicate a valid address value to the read column redundancy multiplexer and the write column redundancy multiplexer, wherein:
         the write column redundancy multiplexer is operable to substitute the bit by writing first data to the redundancy column in response to a first control signal corresponding to the bit substitution column value and a valid address value, the redundancy assist circuit to generate the first control signal in response to the failure being detected, the write column redundancy multiplexer to write the first data to a first column in the first array in response to a second control signal from the redundancy assist circuit, the redundancy assist circuit to generate the second control signal in response to the failure not being detected; and the read column redundancy multiplexer is operable to substitute the bit by reading data from the redundancy column in response to a third control signal corresponding to the bit substitution column value and the valid address value.

17. The system of claim 16 further comprising a decoder coupled to the programmable assist array and the read column redundancy multiplexer, the decoder operable to decode the bit substitution column value.

18. The system of claim 16 further comprising a decoder coupled to the programmable assist array and the write column redundancy multiplexer, the decoder operable to decode the bit substitution column value.

19. A system for implementing redundancy, the system comprising:
   a memory array comprising:
      a first plurality of word lines responsive to a row address;
      a bit substitution column including a bit to be substituted, the bit corresponding to a failure detected by reducing a voltage applied to the memory array; and
      a redundancy column;
   a read column redundancy multiplexer coupled to the memory array;
   a write column redundancy multiplexer coupled to the memory array; and
   a programmable assist array comprising a second plurality of word lines responsive to the row address, wherein for each of the second plurality of word lines, the programmable assist array comprises:
      a memory operable to store a bit substitution column value associated with the bit substitution column;
      a first data output line operable to communicate the bit substitution column value to the read column redundancy multiplexer and the write column redundancy multiplexer; and
      a second data output line operable to communicate a valid address value to the read column redundancy multiplexer and the write column redundancy multiplexer, wherein:
         the write column redundancy multiplexer is operable to substitute the bit by writing data to the redundancy column in response to a first control signal corresponding to the bit substitution column value and a valid address value, the redundancy assist circuit to generate the first control signal in response to the failure being detected, the write column redundancy multiplexer to write the first data to a first column in the first array in response to a second control signal from the redundancy assist circuit the redundancy assist circuit to generate the second control signal in response to the failure not being detected; and
         the read column redundancy multiplexer is operable to substitute the bit by reading the first data from the redundancy column in response to a third control signal corresponding to the bit substitution column value and the valid address value.

20. The system of claim 19 further comprising a decoder coupled to the programmable assist array, the decoder operable to decode the bit substitution column value.

* * * * *